United States Patent [19]

Muenstedt

[11] Patent Number: 4,886,686
[45] Date of Patent: Dec. 12, 1989

[54] CIRCUIT BOARD SUBSTRATES OF IMPROVED THERMAL CONDUCTIVITY

[75] Inventor: Helmut Muenstedt, Wachenheim, Fed. Rep. of Germany

[73] Assignee: BASF Aktiengesellschaft, Ludwigshafen, Fed. Rep. of Germany

[21] Appl. No.: 267,275

[22] Filed: Nov. 4, 1988

[30] Foreign Application Priority Data

Nov. 27, 1987 [DE] Fed. Rep. of Germany ....... 3737889

[51] Int. Cl.$^4$ ............................................... B32B 9/00
[52] U.S. Cl. ........................................ 428/1; 428/156; 428/161; 428/195; 428/209; 428/328; 428/402; 428/413; 428/419; 428/473.5; 428/524; 428/901; 174/68.5; 361/397
[58] Field of Search ............... 428/195, 209, 402, 156, 428/161, 328, 1, 413, 419, 524, 473.5, 901; 174/68.5; 361/397

[56] References Cited

U.S. PATENT DOCUMENTS

| 3,847,867 | 11/1974 | Heath et al. | 528/125 |
| 3,847,869 | 11/1974 | Williams | 528/125 |
| 3,850,885 | 11/1974 | Takekoshi et al. | 528/125 |
| 4,175,175 | 11/1979 | Johnson et al. | 528/125 |
| 4,247,682 | 1/1981 | Dahl | 528/125 |
| 4,594,311 | 6/1986 | Frisch et al. | 430/315 |
| 4,624,997 | 11/1986 | Robeson et al. | 525/534 |
| 4,795,660 | 1/1989 | Cooray et al. | 427/124 |

FOREIGN PATENT DOCUMENTS

| 0001879 | 5/1979 | European Pat. Off. . |
| 0030033 | 6/1981 | European Pat. Off. . |
| 0047999 | 3/1982 | European Pat. Off. . |
| 0097370 | 1/1984 | European Pat. Off. . |
| 0234223 | 9/1987 | European Pat. Off. . |
| 1078234 | 8/1967 | United Kingdom . |

Primary Examiner—Henry F. Epstein
Assistant Examiner—P. J. Ryan
Attorney, Agent, or Firm—Oblon, Spivak, McClelland, Maier & Neustadt

[57] ABSTRACT

A circuit board substrate of good thermal conductivity comprises a composite formed from
(A) an electrically and thermally insulating plastic and
(B) a plastic incorporating a thermally highly conductive filler.

2 Claims, 1 Drawing Sheet

CIRCUIT BOARD SUBSTRATES OF IMPROVED THERMAL CONDUCTIVITY

The present invention relates to circuit board substrates of good thermal conductivity comprising a composite formed from
(A) an electrically and thermally insulating plastic and
(B) a plastic incorporating thermally highly conductive fillers.

The high packing density of electronic components in modern electronic circuits is responsible for the fact that, despite the small amount of heat emitted by an individual component, substantial heat flows have to be dissipated as a whole. Since conventional circuit board substrates (for example epoxy resins) as well as the lately prominent highly heat-resistant thermoplastics are generally poor heat conductors, the heat is only imperfectly dissipative via the circuit board substrate. This gives rise to local heat spots and consequently exposes the electronic components to a high thermal overstress which can impair their functioning and lead to premature aging and hence to component failure.

A prior art development for solving this problem, which is in fact commercially available, takes the form of a composite board made from a metal and a ceramic material (the commercial product being ceramic-coated steel). These composite boards, however, require a resource-intensive processing technology, are very heavy and, what is more, frequently do not even show adequate adhesion between the two fundamentally different materials, metal and ceramic, which form the composite board.

A further possibility are heat sinks, for example metallized throughholes in circuit boards having a continuous metal coating on one side. The holes in this case connect the electronic component with the metal coat present on the other surface of the substrate, thereby bringing about an improvement in heat dissipation. Such systems are described for example in F. N. Sinnadarai, Handbook of Microelectronics Packaging and Interconnection Technology, Electrochemical Publications Ltd., Ayr, Scotland, 1985 on page 243.

Owing to the relatively complicated structure, such products are likewise not always satisfactory.

A further possibility, described by Sinnadurai in the same book on page 245, are mother-daughter composite boards. These boards are produced by bonding a circuit board fitted with a thermoconductive metal core (the daughter board) via a thermoconductive attachment to a generally perpendicularly disposed mother board which can serve as a support for a plurality of daughter boards. Such an arrangement is described there schematically on page 245. It is readily apparent that the range of possible shapes is constrained in these systems within narrow limits.

It is an object of the present invention to provide circuit board substrates of good thermal conductivity which can be prepared in a simple manner in virtually any desired shape.

We nave found that this object is achieved with the circuit board substrates defined at the beginning.

Component (A) of the circuit board substrates according to the invention is an electrically and thermally insulating plastic, preferably an epoxy resin or a highly heat-resistant thermoplastic from the group of the polyaryl ether sulfones, polyaryl ether ketones, polyether imides or liquid-crystalline polymers (thermotropic polymers).

Epoxy resins for composite boards are known per se to the skilled worker and are described in large numbers in the literature, so that no details are required here.

Polyaryl ether sulfones too have been described in a large number of publications, for example German Published Application DAS No. 1,545,106, EP-A No. 47,999, U.S. Pat. No. 4,175,175 and GB-A No. 1,078,234, to name but a few. These patent specifications also describe appropriate processes for preparing polyaryl ether sulfones.

It is also possible to use mixtures of polyaryl ether sulfones as described in EP-A No. 97,370 specifically for the production of circuit board substrates as component A) of the circuit board substrates according to the invention.

Polyaryl ether sulfones based on bisphenol A and 4,4'-dichlorodiphenyl sulfone and on 4,4'-dihydroxydiphenyl sulfone and 4,4'-dichlorodiphenyl sulfone are commercially available.

Polyaryl ether ketones too are known per se and described in a large number of publications. Some of these products are also commercially available (Stilan ® from Raychem and Victrex ® from ICI).

Such products are described for example in EP-A No. 1,879, DE-A No. 2,650,943 and EP-A No. 30,033, to which reference is made for further details.

It will be readily understood that it is also possible to use ether ketone/ether sulfone copolymers having a random or block structure. Such products can be prepared in a conventional copolymerization by feeding in the corresponding monomers either simultaneously or, alternatively, at different times. The former option gives random copolymers, while the latter leads to polymers having a block structure. A process for preparing block copolymers on the basis of polyaryl ether sulfones and polyaryl ether ketones is described for example in EP-A No. 234,223.

The next group of highly heat-resistant thermoplastics which can be used as component A) are polyether imides. They are polymers which are generally obtained by reacting di(ether anhydrides) with organic diamines. Appropriate products are described in U.S. Pat. No. 3,847,867, DE-A No. 2,437,286 and DE-A No. 2,441,539. A commercially available product of this type is Ultem ® from the General Electric Company.

Finally, suitable heat-resistant thermoplastics also include liquid-crystalline polymers, in particular thermotropic polymers. They are thermoplastic polymers which have anisotropic properties in the melt phase, which leads to interesting mechanical properties. Owing to these properties, these products have in recent years attracted more and more interest and are described in a large number of publications, for example A. Blumstein, Liquid Crystalline Order in Polymers, Academic Press, 1978.

In general, it can be said that thermotropic polymers incorporate a certain minimum proportion of units which are linear and as a result confer stiffness on the molecular chain.

Examples of such products generally are wholly aromatic polyesters based on para-hydroxybenzoic acid, terephthalic acid, isophthalic acid, hydroquinone, dihydroxybiphenyl and derivatives thereof. These products may also contain, up to certain limits, nonlinear units, as long as this does not impair the anisotropic, ie. liquid-crystalline, properties.

From the above it will be apparent that the component used as component (A) in the circuit board substrates according to the invention comprises materials known per se whose processing has been mastered and can in the case of the highly heat-resisistant thermoplastics be effected in efficient processes such as injection molding or extrusion.

Component (B) of the circuit board substrates according to the invention is a plastic incorporating thermally highly conductive fillers, in general again a highly heat-resistant thermoplastic of the type also used as an electrically insulating substrate material. The high heat-resistance is necessary because, in the course of the soldering of electronic components, the circuit boards made from the circuit board substrates are briefly exposed to thermal stresses at more than 200° C., in particular at more than 230° C.

Possible heat-resistant thermoplastics for component (B) are the same types of polymer as described above for component (A).

The thermally highly conductive fillers are advantageously metallic fillers, in particular aluminum flake or leaf, which are preferred on account of their ready availability and for economic reasons.

In principle, however, it is also possible to use other fillers which bring about an improvement in the thermal conductivity, for example other metallic fillers such as copper flakes or fibers and the like.

To produce the circuit board substrates according to the invention it is necessary to bond components (A) and (B) to one another to give a sufficiently firm join. This can be accomplished for example by pressmolding together boards made of components (A) and components (B) in the absence or presence of certain adhesives as adhesion promoters.

If not only component (A) but also component (B) contains a matrix comprising a highly heat-resistant thermoplastic polymer, a particularly elegant way of producing virtually any desired shape is coextrusion or two-component injection molding. Such techniques are known per se to those skilled in the art and are described in the relevant literature, so that no details are required here.

Figure 1:
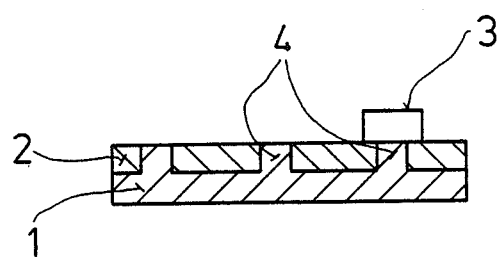
FIG. 1 shows a baseboard of polyaryl ether sulfone filled with aluminum flakes and a second board of polyaryl ether sulfone applied thereto.
Figure 2:
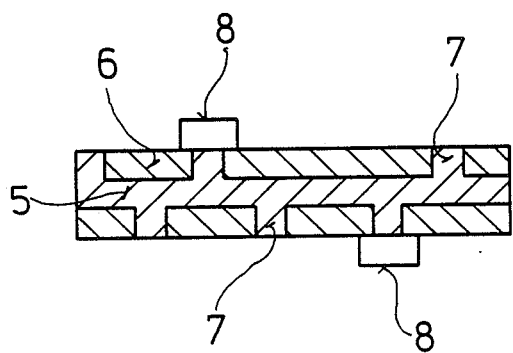
FIG. 2 shows a baseboard of polyaryl ether sulfone filled with aluminum flakes with polyaryl ether sulfone boards applied to both sides thereof.

Two possible embodiments of suitable substrates according to the invention are shown in accompanying FIGS. 1 and 2.

FIG. 1 shows an arrangement comprising a baseboard 1, made of a polyaryl ether sulfone filled with aluminum flakes, and applied thereto a board 2 made of thermally and electrically insulating polyaryl ether sulfone. It can be seen that the components 3 to be mounted on board 2 after metal coating are in connection via cut-outs 4 which serve as heat sinks, although care must of course be taken to ensure that the soldered connections do not come into contact with the metal-filled polyaryl ether sulfone 2, since otherwise short circuits can occur.

The arrangement shown in FIG. 1 can be equipped for example by the surface mounting technique with electronic components, although in this embodiment only one surface can be equipped with components.

FIG. 2 by contrast shows an arrangement where an aluminum flake filled polyaryl ether sulfone 5 has been coated on both sides with thermally and electrically insulating polyaryl ether sulfone 6 in such a way that heat-conducting paths 7 are present on both component sides. Electronic components 8 can then be mounted by a technique similar to that of FIG. 1 on both sides of the circuit board substrate; that is, the embodiment shown in FIG. 2 can be equipped with electronic components on the top-side and the underside. The connections from the topside to the underside for example can take the form of electric conductors insulated from the aluminum flake filled polyaryl ether sulfone, if such throughplating is technically necessary.

The above observations show that the circuit board substrates according to the invention are notable for improved thermal conductivity, compared with conventional epoxy resin systems and systems based on thermally nonconducting highly heat-resistant thermoplastics, and are simple to produce, for example by thermoplastic methods of processing such as extrusion or injection molding, in particular coextrusion or two-component injection molding.

I claim:
1. A circuit board substrate of good thermoconductivity, comprising a composite formed from
    (A) an electrically and thermally insulating plastic and
    (B) a plastic filled with a thermally highly conductive metallic filler, wherein the plastic is an epoxy resin or a highly heat-resistant thermoplastic from the group of the polyaryl ether sulfones, polyaryl ether ketones, polyether imides or thermotropic liquid-crystalline polymers.
2. A circuit board substrate as claimed in claim 1, wherein the metallic filler is aluminum leaf or aluminium flake.

* * * * *

UNITED STATES PATENT AND TRADEMARK OFFICE
CERTIFICATE OF CORRECTION

PATENT NO.  : 4,886,686

DATED       : Dec. 12, 1989

INVENTOR(S) : Helmut Muenstedt

It is certified that error appears in the above-identified patent and that said Letters Patent is hereby corrected as shown below:

On the title page:

The Foreign Application Priority Data is incorrectly recorded "Nov. 27, 1987 [DE]  Fed. Rep. Germany.....3737889" should be:

--Nov. 7, 1987 [DE]  Fed. Rep. Germany......3737889--

Signed and Sealed this

Twentieth Day of November, 1990

*Attest:*

HARRY F. MANBECK, JR.

*Attesting Officer*  *Commissioner of Patents and Trademarks*